United States Patent
Wang et al.

(10) Patent No.: US 6,380,021 B1
(45) Date of Patent: Apr. 30, 2002

(54) ULTRA-SHALLOW JUNCTION FORMATION BY NOVEL PROCESS SEQUENCE FOR PMOSFET

(75) Inventors: Jyh-Haur Wang; Chih-Chiang Wang; Hsien-Chin Lin, all of Hsin-Chu; Kuo-Hua Pan, Taichung; Carlos H. Diaz, Hsin-chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/597,193

(22) Filed: Jun. 20, 2000

(51) Int. Cl.$^7$ ............................................. H01L 21/8238
(52) U.S. Cl. ..................... 438/232; 438/199; 438/306; 438/307; 438/229
(58) Field of Search ................................ 438/199, 301, 438/303, 305, 306, 307, 229, 232

(56) References Cited

U.S. PATENT DOCUMENTS

| | | | |
|---|---|---|---|
| 5,185,280 A | 2/1993 | Houston et al. | 437/44 |
| 5,409,848 A | 4/1995 | Han et al. | 437/35 |
| 5,534,449 A * | 7/1996 | Dennison et al. | |
| 5,576,806 A * | 11/1996 | Dennison et al. | 438/199 |
| 5,668,024 A | 9/1997 | Tsai et al. | 438/199 |
| 5,757,045 A | 5/1998 | Tsai et al. | 257/336 |
| 5,923,969 A | 7/1999 | Ogamatsu | 438/183 |
| 5,985,726 A | 11/1999 | Yu et al. | 438/301 |
| 6,004,854 A * | 12/1999 | Dennison et al. | 438/306 |
| 6,133,082 A * | 10/2000 | Masuoka | 438/227 |
| 6,217,357 B1 * | 4/2001 | Masuoka | 439/199 |
| 6,261,889 B1 * | 7/2001 | Ono | 438/232 |

* cited by examiner

Primary Examiner—Long Pham
(74) Attorney, Agent, or Firm—George O. Saile; Stephen B. Ackerman; Rosemary L.S. Pike

(57) ABSTRACT

A new method for forming ultra-shallow junctions for PMOSFET while reducing short channel effects is described. A semiconductor substrate wafer is provided wherein there is at least one NMOS active area and at least one PMOS active area. Gate electrodes are formed in both the NMOS and PMOS areas. N-type source/drain extensions are implanted into the NMOS area. The wafer is annealed whereby the n-type source/drain extensions are driven in. Thereafter, p-type source/drain extensions are implanted in the PMOS area wherein the p-type source/drain extensions are not subjected to an annealing step. Spacers are formed on sidewalls of the NMOS and PMOS gate electrodes. Source/drain regions are implanted into the NMOS and PMOS areas wherein the source/drain regions are self-aligned to the spacers to complete formation of an integrated circuit device.

19 Claims, 4 Drawing Sheets

ULTRA-SHALLOW JUNCTION FORMATION BY NOVEL PROCESS SEQUENCE FOR PMOSFET

BACKGROUND OF THE INVENTION (1) Field of the Invention

The invention relates to the fabrication of integrated circuit devices, and more particularly, to a method of forming ultra-shallow junctions for PMOSFETs in the fabrication of integrated circuits.

(2) Description of the Prior Art

The major constraint for sub-0.25 $\mu$m technology integrated circuits is short channel effect (SCE). As device sizes decrease, the channel length decreases. Usually, as the channel length is reduced, the threshold voltage decreases. If the threshold voltage drops below its designed value, the device may exhibit excessive drain leakage current. Shallow junctions can contain the short channel effect. However, shallow junctions are more difficult to achieve for PMOS than for NMOS because boron diffuses much faster than arsenic and exhibits severe transient enhanced diffusion (TED). Rapid thermal annealing (RTA) has been proposed to reduce TED in order to achieve shallow junctions. Now, it is commonly accepted to perform an RTA prior to spacer deposition for 0.25 $\mu$m and beyond technology. However, ultra-shallow junctions, less than about 20 to 60 nanometers in depth, cannot be achieved even with this method. It is desired to find a method to fabricate ultra-shallow junctions with improved short channel effect control and without side effects such as reverse short channel effect.

U.S. Pat. No. 5,985,726 to Yu et al teaches the formation of ultra-shallow junctions using dummy gates and LDD and pocket implant processes. U.S. Pat. No. 5,923,969 to Oyamatsu teaches a controlled pocket implant and LDD process using dummy gate. U.S. Pat. Nos. 5,757,045 and 5,668,024 to Tsai et al disclose the formation of pocket implants, LDD, and source/drain extensions followed by RTA. This method could present a problem in forming ultra-shallow junctions. U.S. Pat. No. 5,409,848 to Han et al teaches an angled pocket implant followed by RTA. U.S. Pat. No. 5,185,280 to Houston et al teaches a process including a halo implant.

SUMMARY OF THE INVENTION

A principal object of the present invention is to provide an effective and very manufacturable method of forming ultra-shallow junctions in the fabrication of integrated circuits.

A further object of the invention is to provide a method of forming ultra-shallow junctions while controlling short channel effects.

Another object of the invention is to provide a method of forming ultra-shallow junctions for PMOSFET while controlling short channel effects.

Yet another object is to provide a method of forming ultra-shallow junctions while controlling short channel effects and avoiding side effects such as reverse short channel effects.

Yet another object is to provide a method of forming ultra-shallow junctions while controlling short channel effects wherein a RTA is performed prior to the PLDD implant.

In accordance with the objects of this invention a method for forming ultra-shallow junctions for PMOSFET while reducing short channel effects is achieved. A semiconductor substrate wafer is provided wherein there is at least one NMOS active area and at least one PMOS active area. Gate electrodes are formed in both the NMOS and PMOS areas. N-type source/drain extensions are implanted into the NMOS area. The wafer is annealed whereby the n-type source/drain extensions are driven in. Thereafter, p-type source/drain extensions are implanted in the PMOS area wherein the p-type source/drain implants are not subjected to an annealing step. Spacers are formed on sidewalls of the NMOS and PMOS gate electrodes. Source/drain regions are implanted into the NMOS and PMOS areas wherein the source/drain regions are self-aligned to the spacers to complete formation of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
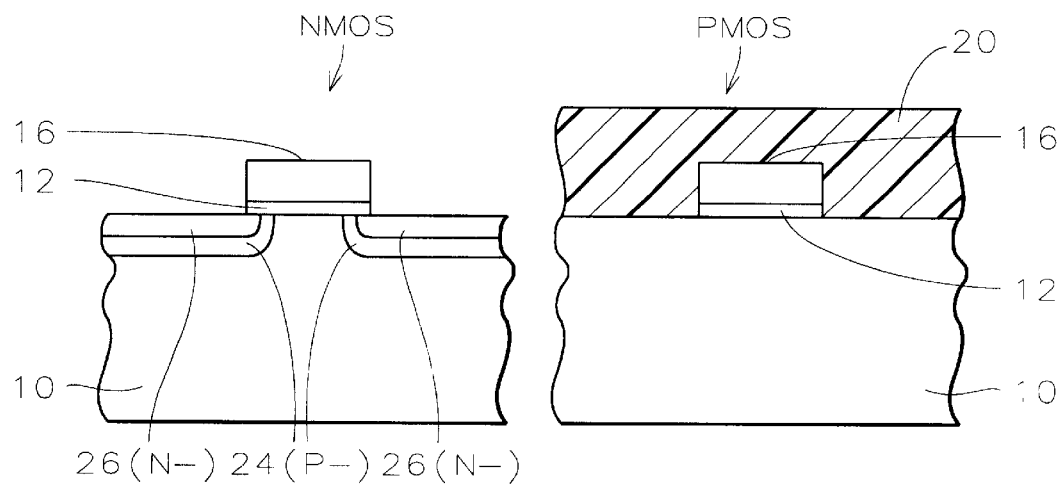
FIGS. 1 through 6 schematically illustrate in cross-sectional representation a preferred embodiment of the present invention.

Referring now more particularly to FIG. 1, there is shown an illustration of an NMOS portion and a PMOS portion of a partially completed, CMOS metal oxide field effect transistor (MOSFET). The semiconductor substrate 10 is preferably composed of silicon having a (100) crystallographic orientation. In an effort to simplify the description and the drawings the dielectric isolation between devices has been only partially shown and will not be described in detail, because they are conventional.

The surface of the silicon substrate 10 is thermally oxidized to form the desired gate oxide 12 thickness. The preferred thickness is between about 15 to 60 Angstroms for 0.25 $\mu$m and below technology.

The polysilicon layer 16 is deposited, for example by low pressure chemical vapor deposition (LPCVD), to a thickness of between about 1000 to 2500 Angstroms. The polysilicon layer 16 is etched away where it is not covered by a mask to form polysilicon gate electrodes 16, as shown.

The source/drain structure of the MOS FET may now be formed. A blockout mask 20 is formed to cover the PMOS portion of the integrated circuit wafer. The NMOS lightly doped source and drain regions will now be formed. First, a p-pocket implant is performed, using indium or boron, for example, depending on the application. The pocket implant uses the NMOS gate as a self-aligned mask to form pocket implants 24 aligned to the gate and partially extending under the gate. The pocket implant will typically have a large tilt angle, causing the implants to extend under the gate. Also, during subsequent thermal cycles, the pocket implant dopant will diffuse laterally under the gate. The NMOS and PMOS pocket implants are optional, but are useful in containing SCE.

Now, an NLDD implant is performed using, for example, arsenic to form lightly doped N- regions 26 self-aligned to the NMOS gate, as shown. These lightly doped regions may be referred to as source/drain extensions. They form the ultra-shallow NMOS junctions, having a depth of between about 20 to 50 nanometers.

Figure 2:
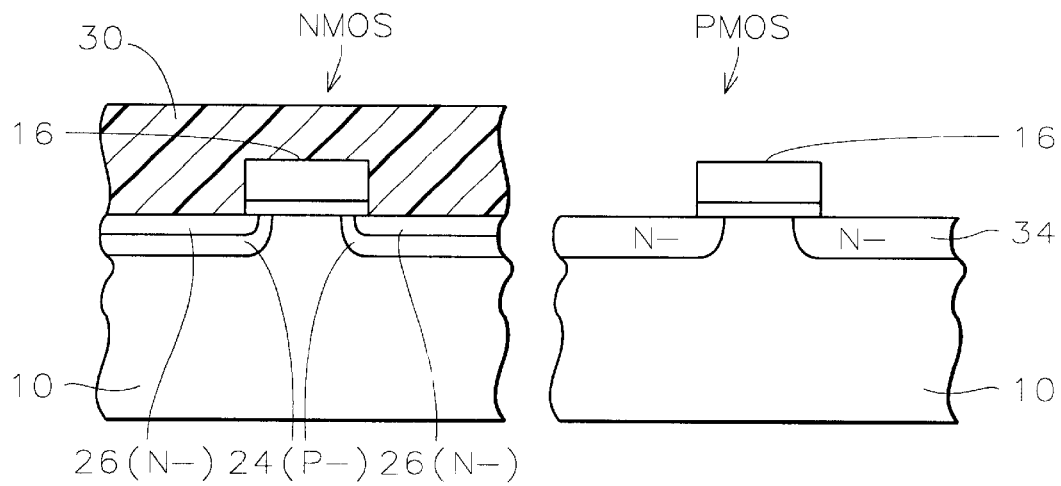
Figure 3:
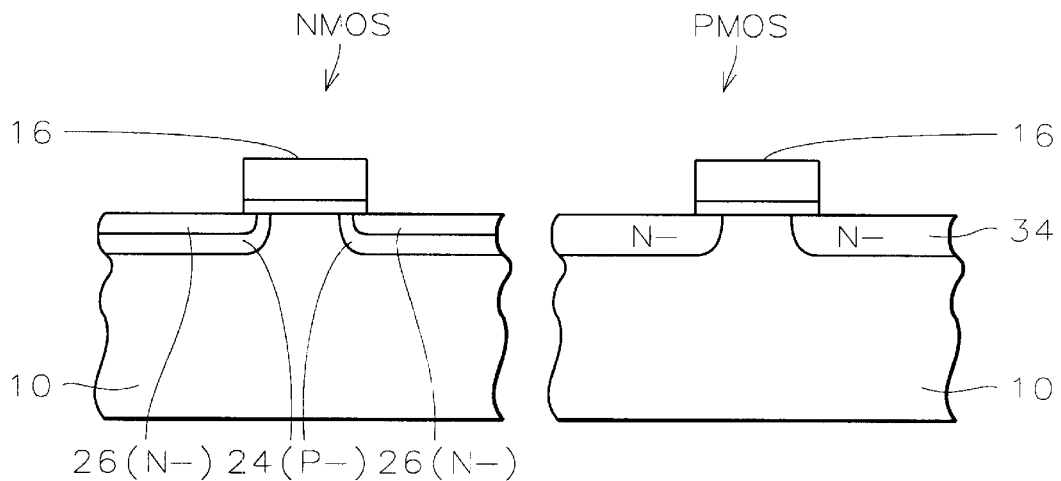

Referring now to FIG. 2, the mask 20 is removed and a second blockout mask 30 is formed to cover the NMOS portion of the integrated circuit wafer. An N-pocket implantation is performed, using, or example, arsenic or phosphorus ions, to form the pocket implants 34, as shown. In the prior art, the PLDD implantation would next be performed. However, in the process of the present invention, the blockout mask 30 is removed and a rapid thermal annealing (RTA) process is now performed. The wafer is annealed, for example, at a temperature of between about 900 to 1050° C. for between about 0 to 30 seconds to activate the NLDD junctions 26, and the P and N pocket implants 24 and 34, as shown in FIG. 3.

Figure 4:
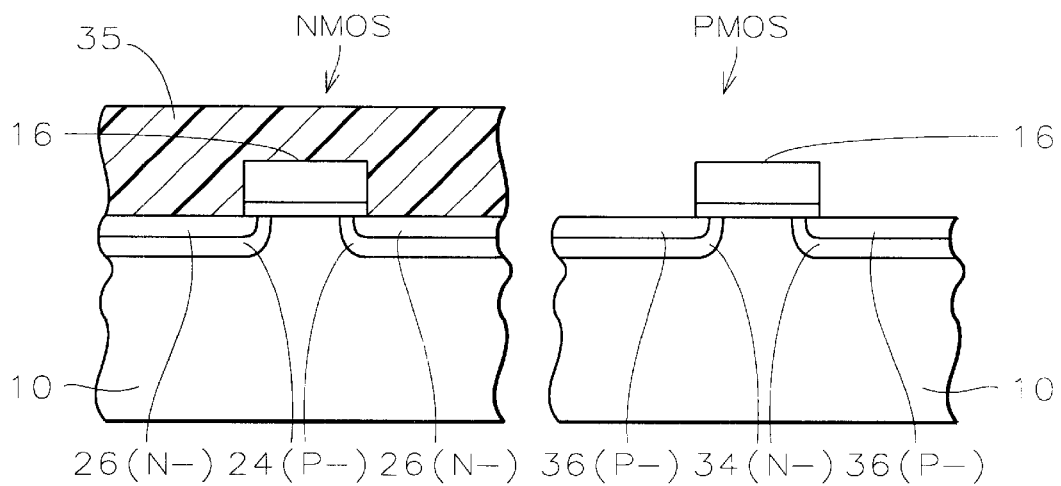

Referring now to FIG. 4, another blockout mask 35 is formed over the NMOS portion of the integrated circuit wafer. The PLDD implantation is performed. Boron ions are implanted into the substrate to form the lightly doped drain P-regions, or p-type source/drain extensions, 36.

Because boron diffuses much faster than arsenic, it is not necessary to perform the RTA after the PLDD implantation. Since the P- ions are not exposed to the high temperature annealing, the junction depth is minimized. The junction depth of the PLDD junctions 36 is between about 30 to 50 nm.

Figure 5:
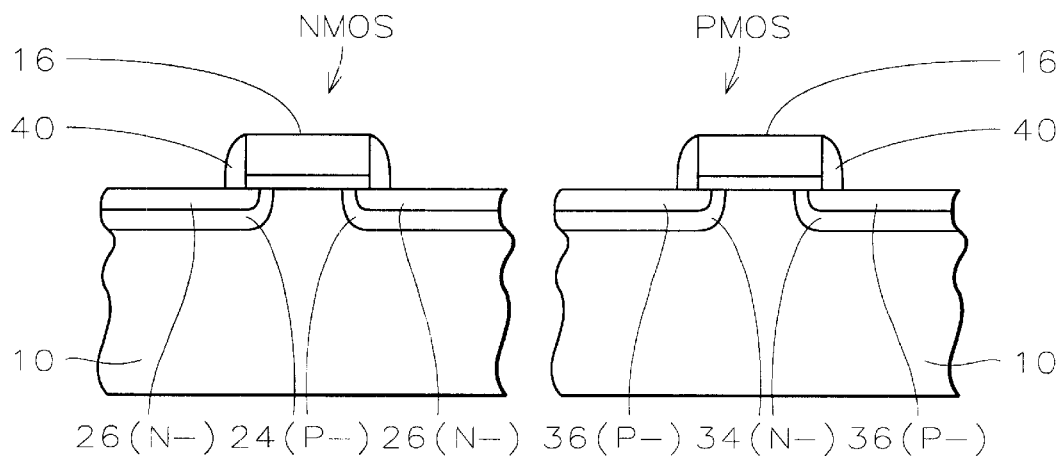
Figure 6:
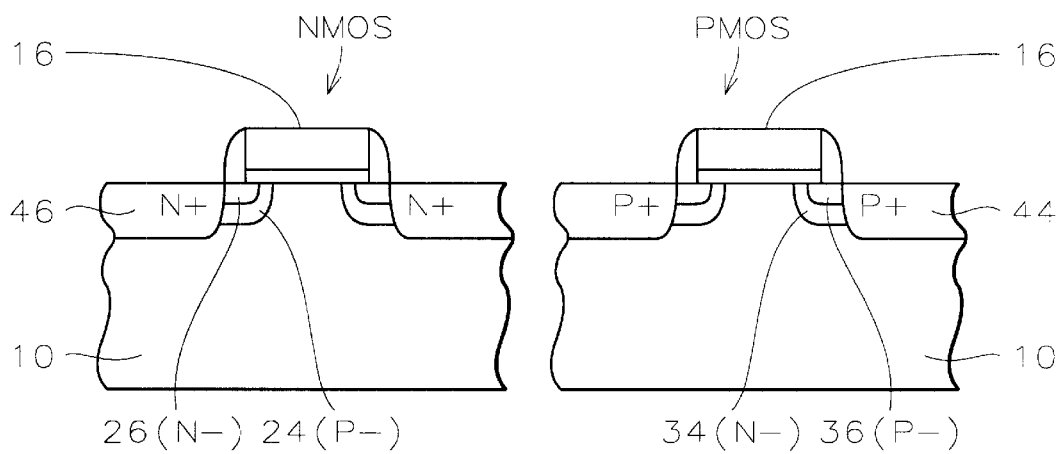

Referring now to FIG. 5, the blockout mask 35 is removed. A dielectric layer is blanket deposited over the substrate and anisotropically etched back to form spacers 40 on the sidewalls of the gate electrodes. Then, heavily doped source/drain implantations are performed to form the source and drain regions 44 and 46 in the PMOS and NMOS portions, respectively, of the integrated circuit wafer. A second RTA will activate and drive in the source and drain junctions.

Figure 7:
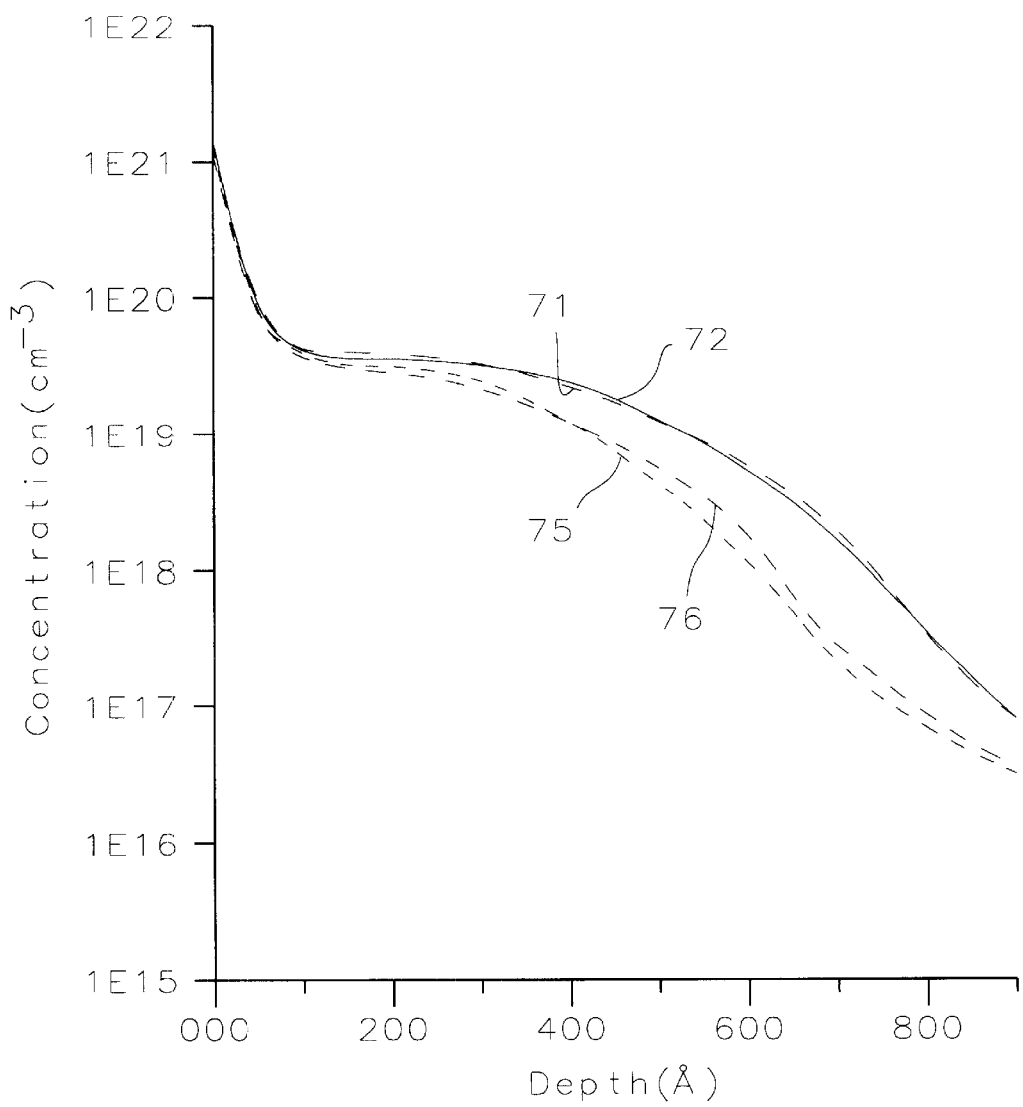
FIG. 7 graphically illustrates ion concentration as a function of junction depth for experimental wafers fabricated by a process of the prior art and by the process of the present invention.

FIG. 7 is a graphical representation of boron ion concentration as a function of junction depth. A blanket wafer experiment was performed in which the RTA was performed either before or after the PLDD implantation and either with or without a N-pocket implant on the PMOS portion of the wafer. The PLDD implantation comprised $BF_2$ ions implanted at an energy of 2 KeV and dosage of 1 E 15 atoms/cm². Line 71 represents the PLDD implantation after pocket implant where the RTA is performed after the PLDD implantation. Line 72 represents the PLDD implantation without a pocket implant where the RTA is performed after the PLDD implantation. Line 75 represents the PLDD implantation after pocket implant where the RTA is performed prior to the PLDD implantation (the inventive process). Line 76 represents the PLDD implantation without a pocket implant where the RTA is performed prior to the PLDD implantation (the inventive process). It can be seen from the graph that junction depth was reduced where the RTA was performed prior to the PLDD implantation; that is, where the PLDD junctions were not annealed.

Performing the RTA prior to the PLDD implantation resulted in the surprising fact that junction depth was reduced. Reduced short channel effects and overlap capacitance improvement were also seen in the process of the invention.

Figure 8:
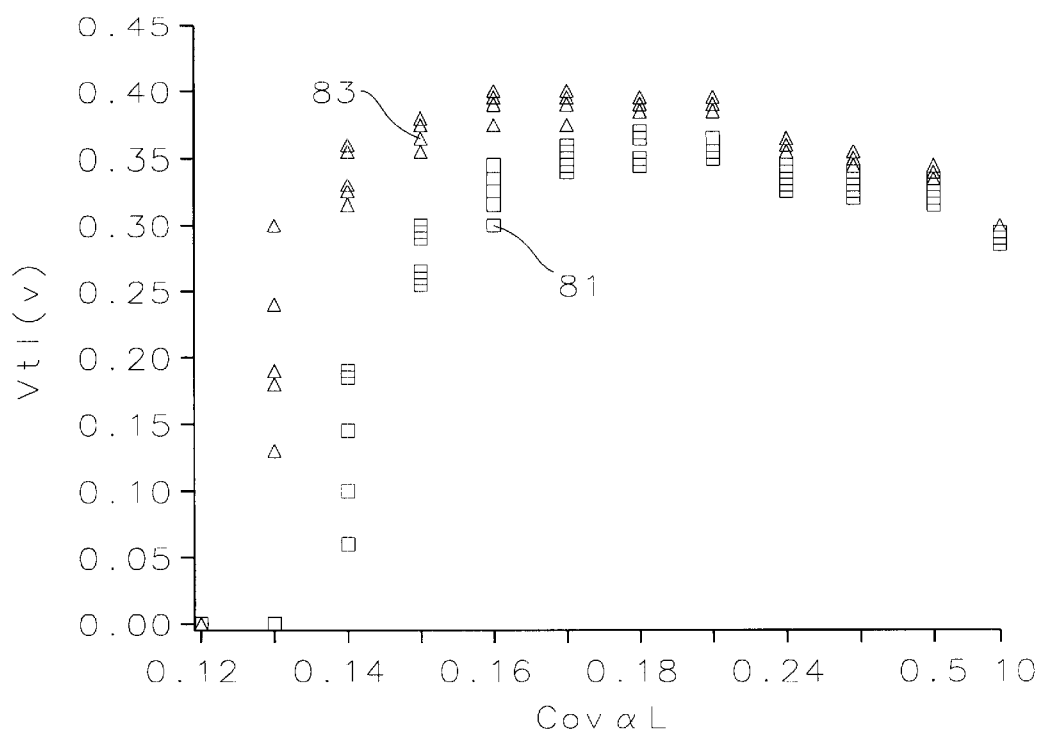
FIG. 8 graphically illustrates threshold voltage as a function of channel length for experimental wafers fabricated by a process of the prior art and by the process of the present invention.

FIG. 8 graphically illustrates threshold voltage as a function of gate channel length. An experiment was performed in which a first wafer 81 was exposed to the process sequence comprising 1) arsenic pocket implant, 2) $BF_2$ LDD implant, and 3) RTA and a second wafer 83 was exposed to the process sequence of the invention comprising 1) arsenic pocket implant, 2) RTA, and 3) $BF_2$ LDD implant. It can be seen that the threshold voltage was higher for wafer 83 of the invention. Thus, short channel effects, which tend to decrease threshold voltage, were reduced using the process of the present invention. Also, wafer 81 showed an overlap capacitance or gate to drain capacitance of 0.63 $\mu f$ while wafer 83 of the invention had an overlap capacitance of 0.55 $\mu f$.

Overlap capacitance is proportional to the junction lateral diffusion distance. If the overlap capacitance is smaller, it indicates a smaller junction lateral diffusion distance. It can be speculated that vertical junction depth is smaller as well.

SIMS data has shown a reduction in junction depth using the process of the invention. A wafer having PLDD junctions formed according to the process of the invention including an arsenic pocket implant showed a junction depth reduction of from 865 Angstroms to 780 Angstroms. Without an arsenic pocket implant, the junction depth reduction was from 875 Angstroms to 785 Angstroms. In both cases, the ion concentration of the junction was 1E17 atoms/cm³.

The inventors have proposed a possible mechanism to explain the surprising improvement found by performing the RTA prior to PLDD implantation. It will be understood by those skilled in the art that the possible mechanism is speculative and may not be the actual or complete mechanism involved. Furthermore, the present invention is not limited to the actual or speculative mechanism, but embodies the novel process sequence described and claimed herein.

Following is an explanation of a possible mechanism involved in the improvement shown in the novel process sequence of the present invention. The threshold temperature of boron enhanced diffusion is greater than or equal to 950° C. If the PLDD is annealed by performing the RTA after PLDD formation, $SiB_4$ will be formed. Silicon boride will inject Si interstitials during spacer deposition to enhance boron diffusion resulting in deeper PLDD junctions. However, if the RTA is performed prior to PLDD formation, the PLDD junctions will not be annealed, $SiB_4$ will not form, and therefore, boron enhanced diffusion will not occur during spacer formation. Transient enhanced diffusion is implantation damage induced boron enhanced diffusion; that is, silicon interstitials will enhance boron diffusion. Boron enhanced diffusion may be caused by $SiB_4$ formation that will inject silicon interstitials. Boron enhanced diffusion could be more dominant than transient enhanced diffusion in sub-0.18 $\mu m$ processes.

Figure 9:
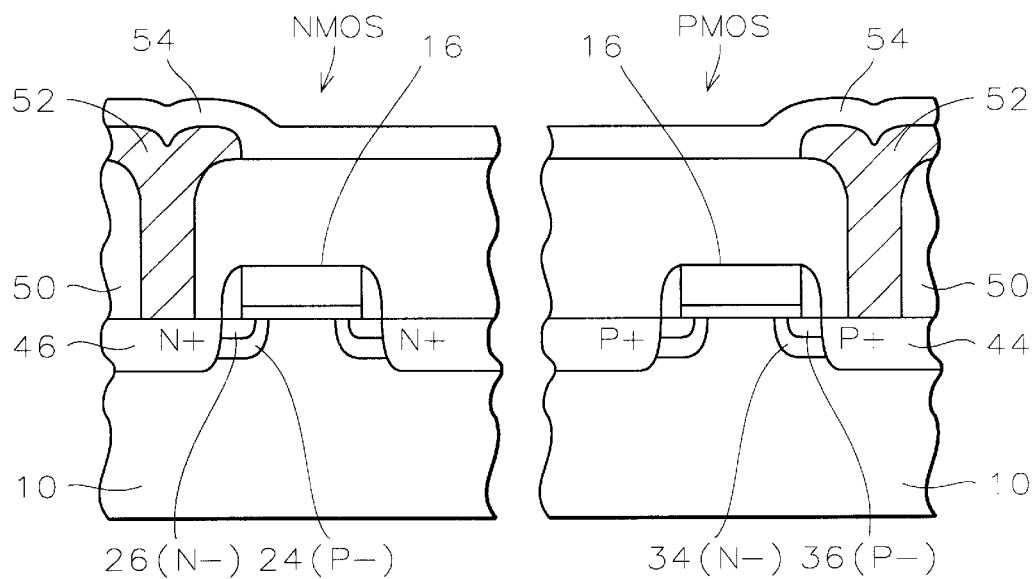
FIG. 9 schematically represents in cross-sectional representation a completed integrated circuit device fabricated according to the process of the present invention.

This completes the formation of the LDD structure. The integrated circuit device is completed as is conventional in the art. For example, as illustrated in FIG. 9, insulating layer 50 is deposited over the surface of the substrate. Contact openings are made through the insulating layer to the underlying semiconductor devices, such as to source/drain regions 44 and 46. A metal layer 52 is deposited and patterned to form electrical connections between the elements of the integrated circuit. A passivation layer 54 completes the fabrication of the integrated circuit.

The process of the invention provides a novel process sequence for forming ultra-shallow junctions for PMOS-FETs. Rapid thermal annealing is performed prior to the PLDD implantation. This process sequence results in better short channel effect control without side effects such as reversed short channel effects. The process sequence of the invention also results in junction depth reduction and overlap capacitance improvement.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:
   providing a semiconductor substrate wafer wherein there is at least one NMOS active area and at least one PMOS active area;
   providing a NMOS gate electrode in said NMOS area and a PMOS gate electrode in said PMOS area;
   implanting p-type pocket implants in said NMOS area;
   implanting n-type source/drain extensions in said NMOS area;
   implanting n-type pocket implants in said PMOS area;
   thereafter annealing said wafer whereby said n-type source/drain extensions are driven in;
   thereafter implanting p-type source/drain extensions in said PMOS area wherein said p-type source/drain implants are not subjected to an annealing step;
   forming spacers on sidewalls of said NMOS gate electrode and said PMOS gate electrode; and
   forming source/drain regions in said NMOS and said PMOS areas wherein said source/drain regions are self-aligned to said spacers to complete formation of said integrated circuit device.

2. The method according to claim 1 wherein said step of implanting said n-type source/drain extensions comprises implanting arsenic ions.

3. The method according to claim 1 wherein said step of implanting said p-type source/drain extensions comprises implanting boron or $BF_2$ ions.

4. The method according to claim 1 wherein said step of annealing said wafer comprises a rapid thermal annealing at a temperature of between about 900 and 1050° C. for between about 0 and 30 seconds.

5. The method according to claim 1 wherein a junction depth of said p-type source/drain extensions is between about 300 and 500 Angstroms.

6. A method of fabricating an integrated circuit device comprising:
   providing a semiconductor substrate wafer wherein there is at least one NMOS active area and at least one PMOS active area;
   providing a NMOS gate electrode in said NMOS area and a PMOS gate electrode in said PMOS area;
   implanting p-type pocket implants in said NMOS area;
   implanting n-type source/drain extensions in said NMOS area;
   implanting n-type pocket implants in said PMOS area;
   thereafter annealing said wafer whereby said n-type source/drain extensions are driven in;
   thereafter implanting p-type source/drain extensions in said PMOS area wherein said p-type source/drain implants are not subjected to an annealing step wherein a junction depth of said p-type source/drain extensions is between 300 and 500 Angstroms;
   forming spacers on sidewalls of said NMOS gate electrode and said PMOS gate electrode; and
   forming source/drain regions in said NMOS and said PMOS areas wherein said source/drain regions are self-aligned to said spacers to complete formation of said integrated circuit device.

7. The method according to claim 6 wherein said step of implanting said p-type pocket implants comprises implanting indium or boron ions.

8. The method according to claim 6 wherein said step of implanting said n-type pocket implants comprises implanting arsenic or phosphorus ions.

9. The method according to claim 6 wherein said step of implanting said n-type source/drain extensions comprises implanting arsenic ions.

10. The method according to claim 6 wherein said step of implanting said p-type source/drain extensions comprises implanting boron or $BF_2$ ions.

11. The method according to claim 6 wherein said step of annealing said wafer comprises a rapid thermal annealing at a temperature of between about 900 and 1050° C. for between about 0 and 30 seconds.

12. A method of fabricating an integrated circuit device comprising:
   providing a semiconductor substrate wafer wherein there is at least one NMOS active area and at least one PMOS active area;
   providing a NMOS gate electrode in said NMOS area and a PMOS gate electrode in said PMOS area;
   implanting p-type pocket implants in said NMOS area;
   implanting n-type source/drain extensions in said NMOS area;
   implanting n-type pocket implants in said PMOS area;
   thereafter annealing said wafer whereby said n-type source/drain extensions are driven in;
   thereafter implanting p-type source/drain extensions in said PMOS area wherein said p-type source/drain implants are not subjected to an annealing step;
   forming spacers on sidewalls of said NMOS gate electrode and said PMOS gate electrode;
   forming source/drain regions in said NMOS and said PMOS areas wherein said source/drain regions are self-aligned to said spacers;
   depositing an insulating layer overlying said NMOS gate electrode and said PMOS gate electrode;
   etching an opening through said insulating layer to one of said source and drain regions; and
   depositing a conducting layer overlying said insulating layer and within said opening and patterning said conducting layer completing the fabrication of said integrated circuit device.

13. The method according to claim 12 wherein said step of annealing said wafer comprises a rapid thermal annealing at a temperature of between about 900 and 1050 ° C. for between about 0 and 30 seconds.

14. The method according to claim 12 wherein a junction depth of said p-type source/drain extensions is between about 300 and 500 Angstroms.

15. A method of fabricating a PMOSFET integrated circuit device comprising:
   providing a semiconductor substrate wafer wherein there is at least one NMOS active area and at least one PMOS active area;
   providing a NMOS gate electrode in said NMOS area and a PMOS gate electrode in said PMOS area;
   forming a first blockout mask covering said PMOS area;
   thereafter implanting p-type pocket implants in said NMOS area;

implanting n-type source/drain extensions in said NMOS area;

removing said first blockout mask;

forming a second blockout mask covering said NMOS area;

thereafter implanting n-type pocket implants in said PMOS area;

removing said second blockout mask;

thereafter annealing said wafer whereby said n-type source/drain extensions are driven in;

thereafter forming a third blockout mask covering said NMOS area;

thereafter implanting p-type source/drain extensions in said PMOS area wherein said p-type source/drain implants are not subjected to an annealing step;

thereafter removing said third blockout mask;

thereafter forming spacers on sidewalls of said NMOS gate electrode and said PMOS gate electrode; and forming source/drain regions in said NMOS and said PMOS areas wherein said source/drain regions are self-aligned to said spacers to complete formation of said PMOSFET integrated circuit device.

16. The method according to claim 15 wherein said step of annealing said wafer comprises a rapid thermal annealing at a temperature of between about 900 and 1050° C. for between about 0 and 30 seconds.

17. The method according to claim 15 wherein a junction depth of said p-type source/drain extensions is between about 300 and 500 Angstroms.

18. The method according to claim 1 wherein said step of implanting said p-type pocket implants comprises implanting indium or boron ions.

19. The method according to claim 1 wherein said step of implanting said n-type pocket implants comprises implanting arsenic or phosphorus ions.

* * * * *